United States Patent [19]

Okano et al.

[11] Patent Number: 4,865,682
[45] Date of Patent: Sep. 12, 1989

[54] GROWTH METHOD OF AN ORGANIC COMPOUND SINGLE CRYSTAL AND A BOAT USED THEREFOR

[75] Inventors: Takeshi Okano, Tsuchiura; Hisanori Fujita, Ibaraki; Eiichiro Nishihara, Tsuchiura, all of Japan

[73] Assignees: Mitsubishi Monsanto Chemical Co., Ltd.; Mitsubishi Chemical Industries, Ltd., both of Tokyo, Japan

[21] Appl. No.: 163,223

[22] Filed: Feb. 26, 1988

Related U.S. Application Data

[63] Continuation of Ser. No. 857,404, Apr. 21, 1986, abandoned, which is a continuation of Ser. No. 663,437, Oct. 22, 1984, abandoned.

[30] Foreign Application Priority Data

Oct. 24, 1983 [JP] Japan .................................. 58-198929

[51] Int. Cl.⁴ ............................................. C30B 15/10
[52] U.S. Cl. ............................ 156/624; 156/DIG. 83; 422/102; 422/104; 422/249; 432/264; 432/265
[58] Field of Search ...................... 156/624, DIG. 83; 422/102, 249, 104; 65/DIG. 8, 33; 432/263, 264, 265

[56] References Cited

U.S. PATENT DOCUMENTS 3,927,697 12/1975 Baumler et al. ................ 65/DIG. 8
4,268,483 5/1981 Davey et al. ............... 156/DIG. 83

FOREIGN PATENT DOCUMENTS 658110 7/1965 Belgium ....................... 156/DIG. 83

OTHER PUBLICATIONS

Kingery et al, "Introduction to Ceramics", 1976, pp. 70–71.

Primary Examiner—David L. Lacey
Assistant Examiner—L. Johnson
Attorney, Agent, or Firm—Burgess, Ryan & Wayne

[57] ABSTRACT

In the boat growth method of the IIIb–Vb group compound, the quartz boat is tridymitized on at least the surface thereof so as to prevent wetting of the boat due to the melt of the compound and hence to enhance the yield of a single crystal.

9 Claims, 2 Drawing Sheets

GROWTH METHOD OF AN ORGANIC COMPOUND SINGLE CRYSTAL AND A BOAT USED THEREFOR

This application is a continuation of application Ser No. 857,404, filed Apr. 21, 1986, now abandoned, which is a continuation of U.S. Ser. No. 663,437 filed Oct. 22, 1984, now abandoned.

BACKGROUND OF THE INVENTION

1. Field of the Invention

The present invention relates to a growth method of an inorganic compound single crystal and a boat used for the growth method of a single crystal. More particularly, the present invention relates to a method for producing, at a high yield, a single crystalline inorganic compound of a IIIb group element(s) and a Vb group element(s) of the Periodic Table by means of a boat growth method. The inorganic compound(s) of a IIIb group element(s) and a Vb group element(s) is hereinafter referred to as an inorganic compound(s).

2. Description of the Prior Art

Single crystalline inorganic compounds, such as GaAs or the like, are produced in most cases by means of the boat growth method. The inorganic compound is melted and then solidified by the gradient freeze (GF) method or the horizontal Bridgeman (HB) method, using a boat. The boat has a semicircular or oval cross section and is made of quartz.

It is known to roughen the inner surface of the boat by means of sand-blasting or the like so as to prevent the inner surface from being wetted by the melt of the inorganic compound. The sand blasting is carried out with finely divided alumina, SiC, or similar powder. If wetting occurs, the silicon of the boat is incorporated into the single crystalline inorganic compound and twins and grain boundaries are generated during growth, thereby lessening the yield of the single crystalline inorganic compound.

The known roughening method is, however, not very effective for preventing wetting in the case of producing a single crystal having a large cross section since the amount of charged melt is great and tends to wet the inner surface of the boat. The known boat growth method involves a difficulty in producing a single crystalline inorganic compound at a high yield.

SUMMARY OF THE INVENTION

It is an object of the present invention to provide a growth method for a single crystalline inorganic compound by using a boat, which method enhances the yield of such compound.

It is another object of the present invention to provide a boat used in the method mentioned above.

The present inventors studied and tried how to enhance the yield of a single crystalline inorganic compound in the boat growth method. In one of the trials, the present inventors subjected the boat to α-crystobalitizing and used the boat, the white, converted quartz powder being formed on the inner surface thereof. The boat could effectively prevent wetting. Nevertheless, the high temperature of more than 1500° C. necessary for converting the quartz to α-crystobalite and the long conversion time make the conversion impractical.

After studies and trials, the present inventors discovered that by roughening and tridymitizing the inner surface of the boat the above-mentioned objects can be attained.

The boat growth method provided in accordance with the present invention is characterized by using a quartz boat having a roughened inner surface, the quartz of the boat being tridymitized on at least the surface of the boat.

The quartz boat according to the present invention is subjected to roughening using SiC, $Al_2O_3$, and other powder. The roughening herein should be construed under the terminology of the boat growth method to mean the formation of minute indentations on the inner surface of a quartz boat for lessening wetting.

When the trydimitizing occurs, whitening of the boat surface is observed, and the trydimitrizing can be verified by an index or powder X-ray photography.

An embodiment of the trydimitizing method is now described.

The roughened quartz boat is pickled and rinsed with water to clean the inner surface thereof. The cleaned quartz boat is dried and then heated to a temperature between a quartz-tridymite transformation temperature, i.e., 830° C., and a tridymite-crystobalite transformation temperature, i.e., 1450° C. A preferred heating temperature is from 900° C. to 1200° C. The holding time in the heating temperature is at least 1 hour, preferably at least 2 hours. A long holding time is not particularly inconvenient. The holding time is preferably 10 hours at the longest in the light of operation efficiency and economy. The heating can be carried out in air. The heating for trydimitizing can be carried out in such a manner that the quartz of the boat is not exposed at the surface of the boat, that is, at least the surface of the boat is trydimitized.

The quartz boat subjected to the heat treatment for trydimitizing at least the surface thereof is used for the growth of the inorganic compounds, such as GaAs, GaP, InAs, InSb, InP, and the like. Preferred inorganic compounds to be grown by the boat method according to the present invention are GaAs, InAs, and others having a low vapor pressure, as they are in the known methods.

An embodiment of the boat growth method according to the present invention is explained with reference to the drawings, illustrating the GF method, although the invented method can be applied to the HB method.

BRIEF DESCRIPTION OF THE DRAWINGS

Referring to FIG. 1, the quartz boat 1 is disposed in an ampoule 2 and has, at its right end in the drawing, a stepped portion 1a for locating a seed crystal for the growth of a single crystal.

Figure 1:
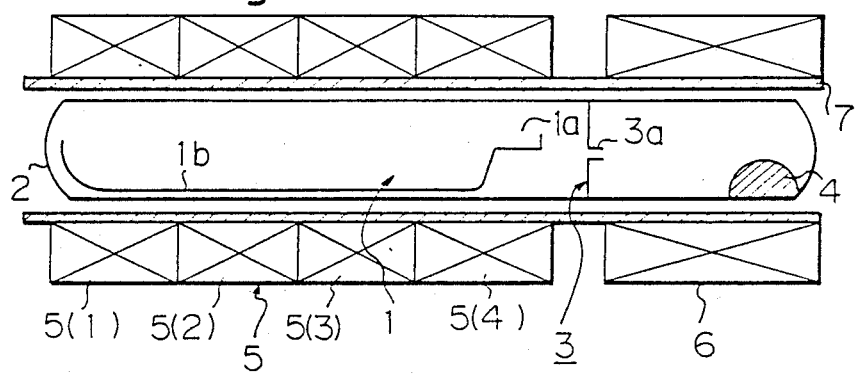
FIG. 1 is a longitudinal cross-sectional view of an apparatus for producing a single crystal by the GF method.

The inner surface 1b of the boat 1 is roughened by sand-blasting or the like. The ampoule 2 is usually made of quartz and consists of a section where the boat 1 is contained and a section where the component including the Vb group element, such as As, is contained. These sections are separated from each other by a partition 3 having a capillary tube 3a. The component including the Vb group element is denoted by reference numeral 4 (hereinafter referred to as the Vb group element 4)

and is, for example, As powder. The Vb group element 4 is vaporized and exerts a pressure, which is equal to the dissociation pressure of the inorganic compound at a temperature in the vicinity of the melting point of inorganic compound, on the melt being single crystallized, thereby preventing the vaporization of the Vb group element from the melt and hence quality deterioration of the single crystal.

Figure 2:
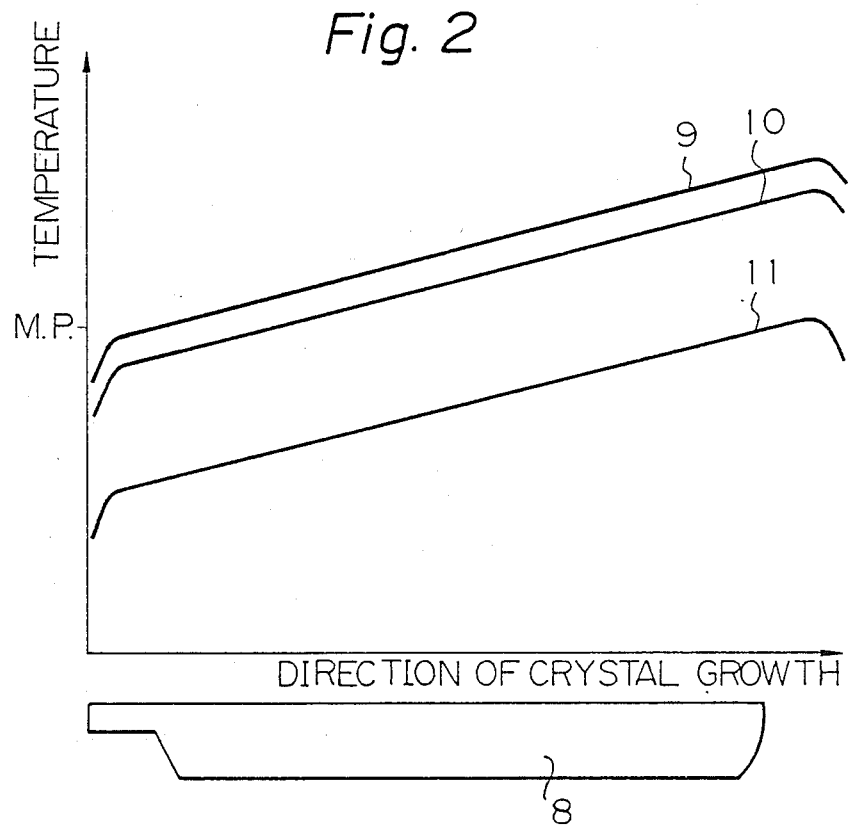
FIG. 2 illustrates the variation of the temperature distribution in the GF method.

The electric furnace 5 creates the temperature distribution as shown in FIG. 2. In order to create the temperature distribution, the electric furnace 5 has heating sections 5(1)–5(4) which are sequence-controlled independently from each other.

The electric furnace 6 is used for heating the Vb group element 4 so as to generate the vapor pressure of the As or the like required for preventing dissociation of the inorganic compound. The vapor generated flows through the capillary tube 3a and enters the section where the boat 1 is contained. In a case where the inorganic compound is GaAs, an As vapor of 1 atm is generated by heating to approximately 610° C.

The heat-homogenizing tube 7 protects the ampoule 2 from external and incidental force and smoothens the temperature distribution.

A predetermined amount of the inorganic compound polycrystals required for forming an inorganic compound ingot is placed in the boat 1. Alternatively, the IIIb group element, such as Ga or the like, is contained in the boat 1, and the Vb group element, such as As, in a stoichiometric amount, is not contained in the boat 1 but is supplied by the As vapor or the like. In this case, the Vb group element 4 is in such an amount that it provides the stoichiometric As as well as the vapor pressure for preventing dissociation of the inorganic compound.

The temperature gradient as shown in FIG. 2 is explained. In FIG. 2, the ordinate indicates the temperature by an optional scale while the abscissa indicates, by an optional scale, the distance from one end of the boat 8, where a seed crystal is placed, to the other end of the boat 8. The boat 8 and the abscissa are shown in FIG. 2 by the identical scale. The origin of the abscissa corresponds, therefore, to the starting point of growth, which advances in the direction of the abscissa. The M.P. of the ordinate indicates the melting point of the inorganic compound.

The temperature distribution varies with the time as shown by curves 9, 10, and 11. In curve 9, the temperature of one end of the boat 8, where the seed crystal is placed, is slightly lower than the M.P. while the temperature of the other end of the boat 8 is higher than the M.P., by approximately 20° C.–100° C. In curves 10 and 11, the profile of the temperature distribution is maintained as in curve 9 and the cooling is performed at a predetermined cooling rate of, for example, from 0.1° C./hr to 10° C./hr.

In the HB method (not illustrated in the drawings), the temperature distribution is maintained constant, and the electric furnace is mechanically displaced relative to the ampoule or vice versa.

Figure 3:
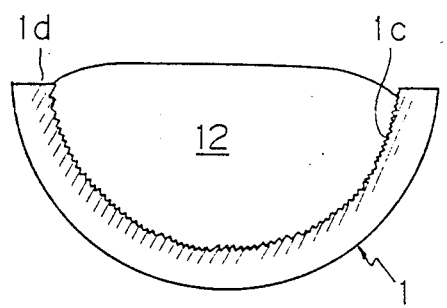
FIG. 3 schematically illustrates a cross section of a quartz boat.

The boat 1 (FIG. 3) has an inner surface 1c which is roughened and tridymitized as shown by 1d, thereby preventing wetting of the inner surface 1c due to the melt 12 which is in contact with the boat surface. The single crystalline inorganic compound can therefore be produced at a high yield and a high purity. In addition, the EPD (etch-pit density) of the single crystalline inorganic compound is low.

The present invention is further explained by way of an example.

EXAMPLE (Heat Treatment of Quartz Boat)

The boat used was made of quartz and had a semicircular cross section 53 mm in diameter and a total length of 300 mm. The inner surface of the boat was roughened by sand blasting with alumina powder (−300 mesh). The boat was then cleaned with acid and water and subsequently dried. The boat was inserted into the electric furnace and heated up to a temperature of 950° C. A temperature of from 900° C. maintained for 3 hours, followed by lowering of the temperature.

(Growth of a GaAs Single Crystal)

GaAs polycrystals in an amount of 1670 g were contained in the boat, which was heat-treated as described above. The seed crystal was a GaAs single crystal having a <111> As surface for seeding growth in the <111> direction. The difference in temperature between the ends of the boat was 70° C., and the temperature of the end of the boat where the seed crystal was placed was 1235° C. The cooling rate was 0.5° C./hr.

The yield of the single crystal was 73% by weight based on the total weight of the ingot produced. The inner surface of the boat did not exhibit wetting at all. The single crystal exhibited an EPD of 3500/cm$^2$ and a Si concentration of 10$^{16}$/cm$^3$ or less.

The above-described growth procedure of a GaAs single crystal was repeated ten times. In each growth procedure, the yield of the single crystal was 70% or higher.

COMPARATIVE EXAMPLE

The same procedure as in the Example was carried out except that the quartz boat was not subjected to the heat treatment. In the production of a GaAs single crystal, wetting was generated on a part of the boat 60 mm to 130 mm distant from the seed crystal. The yield of the single crystal was 28%, the EPD was 85000/cm$^2$, and the Si concentration was 10$^{17}$/cm$^3$.

We claim:

1. In a method for forming a single crystal of GaAs which comprises crystallizing a melt of GaAs under controlled conditions in a quartz boat wherein said crystal is grown within said boat and in which at least a surface of the boat in contact with the melt has been sufficiently roughened to reduce wetting by the melt, the improvement which comprises: providing a quartz boat with at least a roughened surface is to contact the melt, tridymitizing said surface by heating the boat at a temperature of from about 830° C. to 1450° C. for from about 1 to 10 hours, to further reduce wetting by the melt and to thereby increase the yield of said single GaAs crystal, and thereafter growing said single GaAs crystal employing said boat.

2. A method according to claim 1, wherein said boat is heated to a temperature of from 830° C. to 1200° C. for tridymitizing.

3. The method of claim 1 wherein the roughened surface is roughened by contact with Al$_2$O$_3$.

4. The method of claim 1 wherein the roughened surface is roughened by contact with SiC.

5. The method of claim 1 wherein said tridymitizing is effected by heating said boat at a temperature of from about 900° C. to 1200° C. for from 2 to 10 hours.

6. In a method for growing a single crystal of GaAs utilizing the boat growth method wherein said crystal is grown within said boat, the improvement which comprises
 (a) preparing a quartz boat by:
  (i) contacting the inner surface of said boat with an inorganic powder under conditions whereby said surface is roughened to reduce wetting;
  (ii) cleaning said inner roughened surface with acid;
  (iii) washing and drying said inner roughened surface; and
  (iv) tridymitizing said surface by heating said boat at a temperature of from about 830° C. to 1450° C. for from about 1 to 10 hours, and then cooling to further reduce wetting by the melt and to thereby increase the yield of said single GaAs crystal and
 (b) growing said single GaAs crystal in said quartz boat.

7. The method of claim 6 wherein said inorganic powder is $Al_2O_3$.

8. The method of claim 6 wherein said inorganic powder is SiC.

9. The method of claim 6 wherein said tridymitizing is effected by heating said boat at a temperature of from about 900° C. to 1200° C. for from about 2 to 10 hours.